United States Patent
Kim et al.

(10) Patent No.: US 7,838,414 B2
(45) Date of Patent: Nov. 23, 2010

(54) METHOD FOR MANUFACTURING SEMICONDUCTOR DEVICE UTILIZING LOW DIELECTRIC LAYER FILLING GAPS BETWEEN METAL LINES

(75) Inventors: Chan Bae Kim, Gyeonggi-do (KR); Jong Min Lee, Gyeonggi-do (KR); Chae O Chung, Gyeonggi-do (KR); Hyeon Ju An, Gyeonggi-do (KR); Hyo Seok Lee, Gyeonggi-do (KR); Sung Kyu Min, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/834,264

(22) Filed: Aug. 6, 2007

(65) Prior Publication Data
US 2008/0318437 A1    Dec. 25, 2008

(30) Foreign Application Priority Data
Jun. 20, 2007    (KR) .................. 10-2007-0060775

(51) Int. Cl.
*H01L 21/4763* (2006.01)
(52) U.S. Cl. .............. 438/628; 438/629; 438/637; 438/643; 438/644
(58) Field of Classification Search ........... 438/628, 438/629, 637, 643, 644, FOR. 355
See application file for complete search history.

(56) References Cited

U.S. PATENT DOCUMENTS

| | | | |
|---|---|---|---|
| 6,331,480 B1 | 12/2001 | Tsai et al. | |
| 6,372,392 B1 * | 4/2002 | Hoshino et al. | 430/5 |
| 6,583,067 B2 | 6/2003 | Chang et al. | |
| 6,962,869 B1 | 11/2005 | Bao et al. | |
| 6,974,762 B2 | 12/2005 | Gracias et al. | |
| 7,030,041 B2 | 4/2006 | Li et al. | |
| 7,102,232 B2 | 9/2006 | Clevenger et al. | |
| 2002/0141911 A1 * | 10/2002 | Ishii et al. | 422/174 |
| 2003/0203508 A1 * | 10/2003 | Yates et al. | 438/1 |
| 2007/0048955 A1 * | 3/2007 | Yates et al. | 438/309 |

FOREIGN PATENT DOCUMENTS

JP    2006-165573    6/2006

* cited by examiner

*Primary Examiner*—N Drew Richards
*Assistant Examiner*—Joannie A Garcia
(74) *Attorney, Agent, or Firm*—Ladas & Parry LLP

(57) ABSTRACT

A semiconductor device is manufactured by forming a low dielectric constant layer on a semiconductor substrate which is formed with metal lines; implementing primary ultraviolet treatment of the low dielectric constant layer; forming a capping layer on the low dielectric constant layer having undergone the primary ultraviolet treatment; and implementing secondary ultraviolet treatment of the low dielectric constant layer including the capping layer.

12 Claims, 3 Drawing Sheets

METHOD FOR MANUFACTURING SEMICONDUCTOR DEVICE UTILIZING LOW DIELECTRIC LAYER FILLING GAPS BETWEEN METAL LINES

CROSS-REFERENCE TO RELATED APPLICATIONS

The present application claims priority to Korean patent application number 10-2007-0060775 filed on Jun. 20, 2007, which is incorporated herein by reference in its entirety.

BACKGROUND OF THE INVENTION

The present invention relates to a method for manufacturing a semiconductor device, and more particularly to a method for manufacturing a semiconductor device which can improve the operation characteristics of a semiconductor device.

In manufacturing a semiconductor device, metal lines are used to electrically connect elements to elements and lines to lines. As the semiconductor devices are more highly integrated, the widths and contact areas of metal lines decrease, and the resistances of the metal lines (including the contact resistance) increase. As the interval between a metal line and a contact plug becomes narrower, the parasitic capacitance induced by an insulation layer insulating the metal line increases.

Under this situation, various processing techniques for decreasing the resistance of a metal line and reducing the parasitic capacitance as mentioned above have been suggested. For example, attempts were made to use a low dielectric constant layer having a dielectric constant K not exceeding 2.9 that is lower than the 3.2 dielectric constant of a silicon oxide layer as the material of an insulation layer for filling the space between metal lines as the low dielectric constant layer also exhibits excellent gap-filling characteristics.

If a low dielectric constant layer is formed to fill the gap between metal lines, it may prevent the parasitic capacitance from being produced, which in turn may increase the operational speed of the semiconductor device and reduce the cross-talk between metal lines.

Hereafter, a conventional method for manufacturing a semiconductor device utilizing a low dielectric constant layer to fill the gap between metal lines will be briefly described.

An interlayer dielectric is formed on a semiconductor substrate, which is formed with a lower structure including transistors, to cover the lower structure. After depositing a metal layer on the interlayer dielectric, metal lines are formed by patterning the deposited metal layer.

A low dielectric constant layer is then deposited on the interlayer dielectric including the metal lines to cover the metal lines. The low dielectric constant layer is generally deposited in a spin-on type. The resultant substrate formed with the low dielectric constant layer is heat-treated in a furnace. A capping layer made of an oxide layer is formed on the low dielectric constant layer.

However, since the low dielectric constant layer has poor mechanical characteristics such as in strength and hardness, fails occur in the form of cracks appearing in the low dielectric constant layer or the low dielectric constant layer being lifted.

These fails can be prevented to some extent by implementing a heat treatment using ultraviolet (UV) rays and then forming a capping layer made of an oxide layer on the heat-treated low dielectric constant layer instead of performing a heat treatment in a furnace. Nevertheless, when implementing the heat treatment, the adhesive force of the low dielectric constant layer is reduced, by which the low dielectric constant layer can be lifted or the capping layer can be removed.

To cope with this problem, a method has been proposed, in which a heat treatment is implemented using ultraviolet rays after depositing the capping layer on the low dielectric constant layer. In this method, the adhesive force of the low dielectric constant layer can be increased since Si—O cross-linking is increased between the low dielectric constant layer and the capping layer.

However, in this case, C-based or H-based foreign substance contained in the low dielectric constant layer is outgassed, because the capping layer is deposited on the low dielectric constant layer having not undergone a heat treatment, and this leads to pollute the process chamber for depositing the capping layer, thereby causing poor deposition of the capping layer.

As a consequence, an additional cleaning process for removing the foreign substance in the process chamber is needed, by which time and cost for manufacturing a semiconductor device are increased, and a manufacturing yield is decreased.

SUMMARY OF THE INVENTION

An embodiment of the present invention is directed to a method for manufacturing a semiconductor device which can improve the quality of a low dielectric constant layer.

Also, an embodiment of the present invention is directed to a method for manufacturing a semiconductor device which can increase a manufacturing yield.

In one aspect, a method for manufacturing a semiconductor device comprises the steps of forming a low dielectric constant layer on a semiconductor substrate which is formed with conductive lines; implementing primary ultraviolet treatment of the low dielectric constant layer; forming a capping layer on the low dielectric constant layer having undergone the primary ultraviolet treatment; and implementing secondary ultraviolet treatment of the low dielectric constant layer including the capping layer.

The conductive lines are any one of gate lines, bit lines and metal lines.

Before the step of forming the low dielectric constant layer, the method further comprises the step of forming a linear oxide layer on the semiconductor substrate including the conductive lines.

After the step of forming the low dielectric constant layer, the method further comprises the step of baking the low dielectric constant layer.

Baking is implemented at a temperature of 300~350° C. for 5~60 seconds.

The primary ultraviolet treatment is implemented for 3~5 minutes using ultraviolet rays which have a wavelength of 300~500 nm.

The capping layer is made of an oxide layer.

The oxide layer is formed at a temperature of 350~450° C. through PE-CVD.

The secondary ultraviolet treatment is implemented using ultraviolet rays which have a wavelength of 170~300 nm.

In another aspect, a method for manufacturing a semiconductor device comprises the steps of forming a low dielectric constant layer to fill gaps between conductive lines; implementing primary outgassing of an outgassing source contained in the low dielectric constant layer; implementing secondary outgassing of the outgassing source remained after the primary outgassing; forming a capping layer on the low dielectric constant layer having undergone the secondary outgassing; and strengthening adhesion in an interface between the low dielectric constant layer and the capping layer.

The conductive lines are any one of gate lines, bit lines and metal lines.

The step of implementing primary outgassing is conducted by baking the low dielectric constant layer at a temperature of 300~350° C. for 5~60 seconds.

The step of implementing secondary outgassing is conducted through ultraviolet treatment of the low dielectric constant layer.

The second outgassing is performed to remove a —CH— based outgassing source and a porogen.

The ultraviolet treatment is implemented for 3~5 minutes using ultraviolet rays which have a wavelength of 300~500 nm.

The capping layer is made of an oxide layer.

The oxide layer is formed at a temperature of 350~450° C. through PE-CVD.

The step of strengthening adhesion in the interface between the low dielectric constant layer and the capping layer is implemented through ultraviolet treatment.

By the ultraviolet treatment, foreign substance in the interface between the low dielectric constant layer and the capping layer is removed, such that a mutual adhesion —Si-based and —O-based of the low dielectric constant layer and —Si-based and —O-based of the capping layer is improved.

The ultraviolet treatment is conducted using ultraviolet rays which have a wavelength of 170~300 nm.

The third step of implementing the secondary outgassing and the fifth step of strengthening adhesion in the interface between the low dielectric constant layer and the capping layer are conducted using ultraviolet rays, and a wavelength of ultraviolet rays used in the third step is shorter than that of ultraviolet rays used in the fifth step.

DESCRIPTION OF SPECIFIC EMBODIMENTS

In an embodiment of the present invention, a low dielectric constant layer is deposited on a substrate having conductive lines (for example, gate lines, bit lines or metal lines, preferably metal lines) formed thereon in order to fill the gaps between the conductive lines, and then the low dielectric constant layer is heat-treated using ultraviolet rays. The heat treatment is divided into a primary ultraviolet treatment which uses ultraviolet rays having a wavelength and a secondary ultraviolet treatment which uses ultraviolet rays having a shorter wavelength than the wavelength of the ultraviolet rays used in the primary ultraviolet treatment process. The secondary ultraviolet treatment is implemented in a state in which a capping layer is deposited on the low dielectric constant layer, which has undergone the primary ultraviolet treatment.

Consequently, in an embodiment of the present invention, by implementing a heat treatment using ultraviolet rays instead of a conventional heat treatment implemented in a furnace, it is possible to prevent the mechanical characteristics of the lower dielectric constant layer from being degraded. As a result, in the subsequent processes, fails such as occurrence of cracks in the low dielectric constant layer and lifting of the low dielectric constant layer are avoided.

Also, in an embodiment of the present invention, since the source gas of outgassing, for example, the —CH-based foreign substance, which is contained in the low dielectric constant layer, is removed through the primary ultraviolet treatment, when depositing the capping layer, poor deposition of the capping layer due to outgassing can be prevented.

In addition, in an embodiment of the present invention, because the foreign substance found between the low dielectric constant layer and the capping layer is removed through the secondary ultraviolet treatment, the adhesive force of the low dielectric constant layer is increased, and, because the Si—O cross-linking is increased in the low dielectric constant layer and the capping layer, the mechanical characteristics of the layers are effectively improved.

Hence, because the mechanical characteristics and the layer quality such as adhesive force of the low dielectric constant layer are improved in the present invention, the operational speed and the reliability of a semiconductor device are improved, while increasing the manufacturing yield.

Hereafter, a method for manufacturing a semiconductor device in accordance with an embodiment of the present invention will be described with reference to the attached drawings.

FIGS. 1A through 1F are cross-sectional views illustrating the processes of a method for manufacturing a semiconductor device in accordance with an embodiment of the present invention.

Figure 1A:
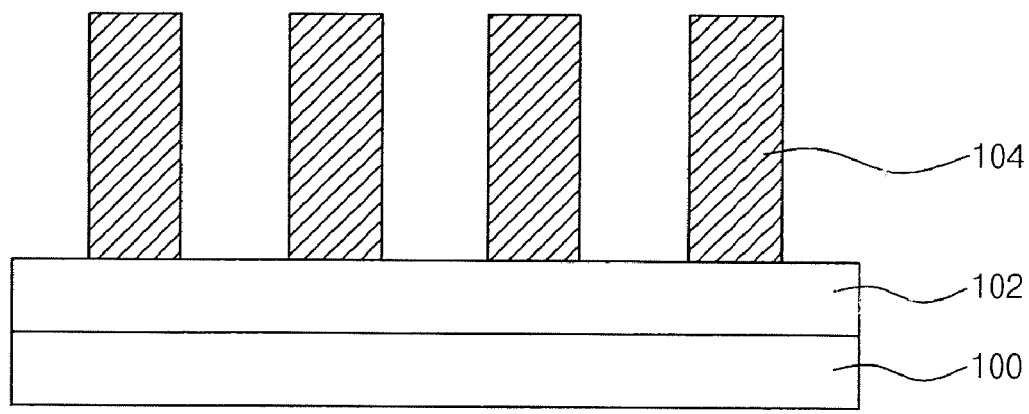
FIGS. 1A through 1F are cross-sectional views illustrating the processes of a method for manufacturing a semiconductor device in accordance with an embodiment of the present invention.

Referring to FIG. 1A, an interlayer dielectric 102 is deposited on a semiconductor substrate 100, which is formed with a lower structure including transistors (not shown), to cover the lower structure. Thereafter, the surface of the interlayer dielectric 102 is planarized by performing a chemical mechanical polishing (hereinafter "CMP"). Then, after depositing a metal layer on the planarized interlayer dielectric 102, metal lines 104 are formed by etching the metal layer.

Figure 1B:
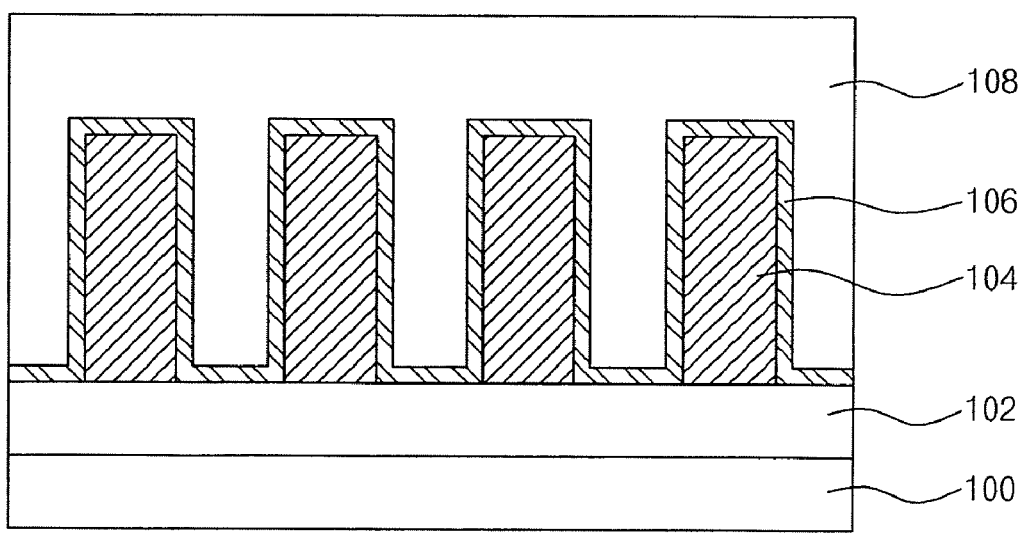

Referring to FIG. 1B, a linear oxide layer 106 is deposited on the interlayer dielectric 102 including the metal lines 104. After a low dielectric constant layer 108 is deposited on the linear oxide layer 106 to fill the gaps between the metal lines 104, the surface of the low dielectric constant layer 108 is planarized through CMP. The low dielectric constant layer 108 is formed as a layer which has a dielectric constant K not exceeding 2.9, which is lower than 3.2 being the dielectric constant of a silicon oxide layer.

Figure 1C:
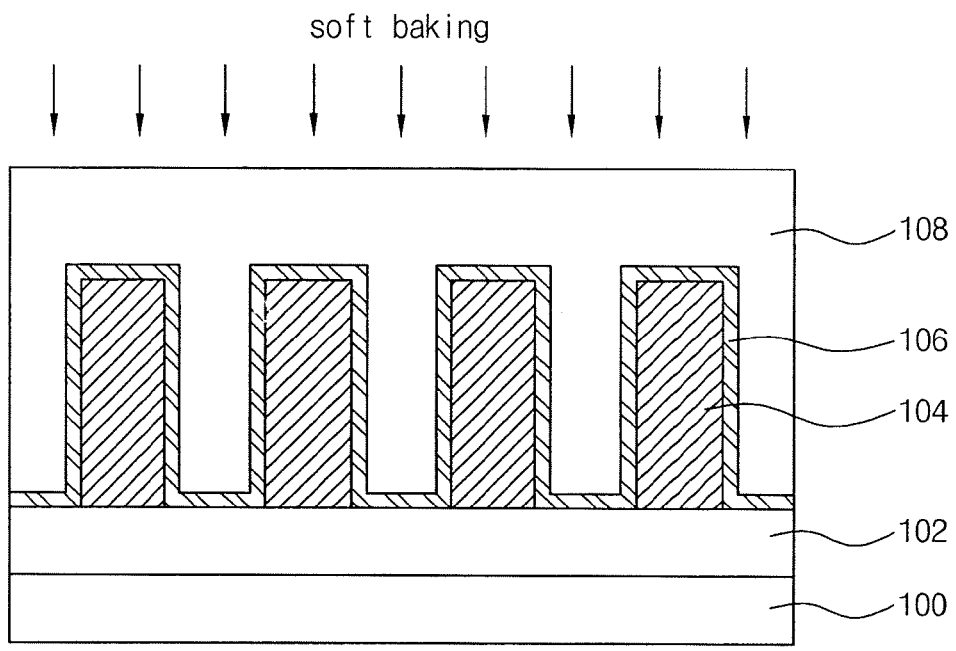

Referring to FIG. 1C, the low dielectric constant layer 108 is soft-baked. Soft-baking is implemented at a temperature of 300~350° C. for no greater than 1 minute, preferably for 5~60 seconds. As a result of the soft-baking, the foreign substance contained in the low dielectric constant layer 108 is primarily outgassed.

Figure 1D:
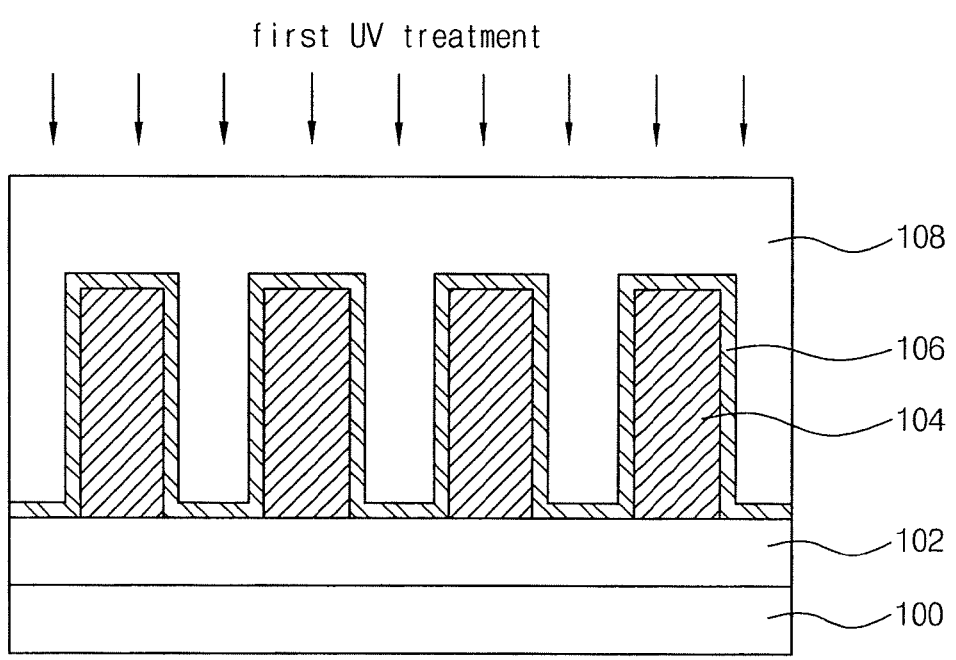

Referring to FIG. 1D, the soft-baked low dielectric constant layer 108 undergoes a primary ultraviolet treatment using ultraviolet rays having a long wavelength, preferably a wavelength in the range of 300~500 nm. Preferably, the primary ultraviolet treatment is implemented for 3~5 minutes.

Through the primary ultraviolet treatment, the foreign substance contained in the low dielectric constant layer 108, for example, the —CH-based foreign substance having a binding energy of 2~3 eV is secondarily outgassed so as to remove the foreign substance completely. The —CH-based foreign substance includes gasses that are outgassed during the subsequent step of depositing a capping layer. Therefore, since it is possible to completely remove the —CH-based foreign substance through the primary ultraviolet treatment according to an embodiment of the present invention, the inside space of the process chamber is prevented from being polluted by the outgassed gases in the chamber, by which the process for depositing the capping layer can be stably carried out.

Figure 1E:
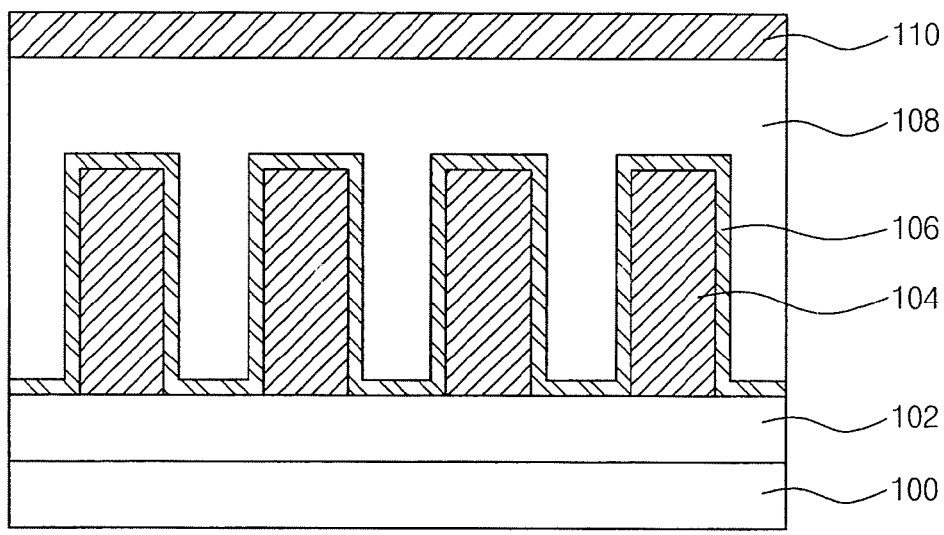

Referring to FIG. 1E, a capping layer 110, which is made of an oxide layer, is formed on the low dielectric constant layer 108 which has undergone the primary ultraviolet treatment. The capping layer 110 is formed through a plasma enhanced-chemical vapor deposition process (PE-CVD). The PE-CVD for forming the capping layer 110 is implemented at a temperature of 350~450° C., preferably 400° C. The capping layer 110 functions to improve the mechanical characteristics of the low dielectric constant layer 108.

Figure 1F:
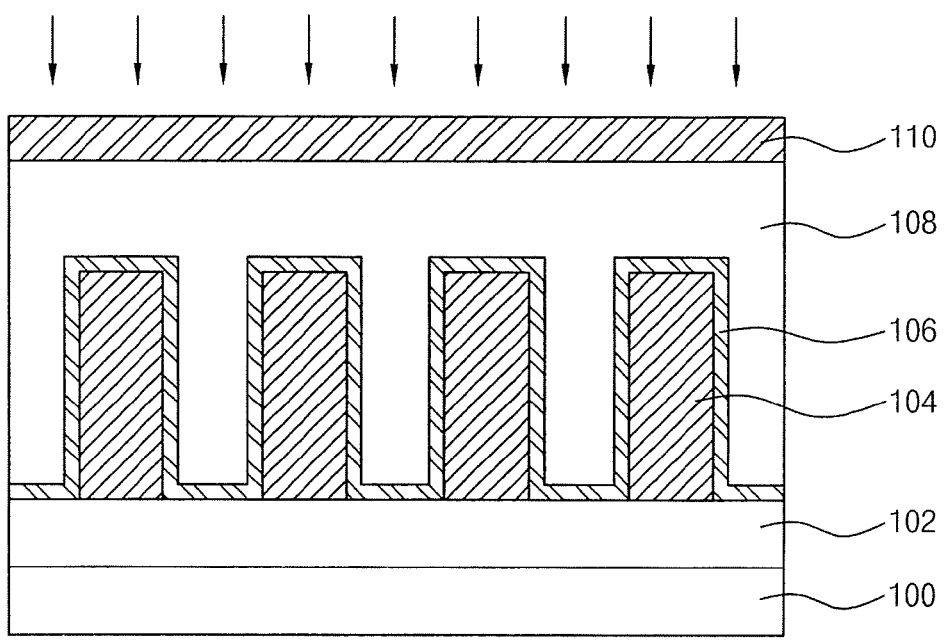

Referring to FIG. 1F, the low dielectric constant layer 108 including the capping layer 110 undergoes a secondary ultraviolet treatment using the ultraviolet rays having a short wavelength, preferably a wavelength in the range of 170~300 nm.

Hence, the foreign substance produced in the interface between the low dielectric constant layer 108 and the capping layer 110 can be removed through a secondary ultraviolet treatment, by which the adhesive force between the low dielectric constant layer 108 and the capping layer 110 can be increased. As a result, the low dielectric constant layer 108 is prevented from being lifted, or the capping layer 110 is prevented from being removed. Further, the ultraviolet rays used in the secondary ultraviolet treatment can decompose the foreign substances bonded with the binding energy of 4.5~8 eV, as such the bond with foreign substances that are produced in the interface between the low dielectric constant layer 108 and the capping layer 110 can be decomposed. As a result, as the decomposed Si and O bond with each other, a mutual adhesion between —Si-based and —O-based of the low dielectric constant layer and —Si-based and —O-based of the capping layer, that is, Si—O cross-linking can be further increased. Thus, the mechanical characteristics and the density of the low dielectric constant layer 108 and the capping layer 110 are improved according to an embodiment of the present invention.

Thereafter, the fabrication of a semiconductor device according to an embodiment of the present invention is completed by sequentially conducting a series of well-known subsequent processes, although these subsequent processes are not shown in the drawings.

As it is apparent from the above description according to an embodiment of the present invention fails that are caused due to the mechanical defects of the low dielectric constant layer can be reduced, because a low dielectric constant layer formed to fill the gaps between metal lines is heat-treated not in a furnace but by irradiating ultraviolet rays and a capping layer is formed on the low dielectric constant layer.

Further, the heat treatment of the present invention implemented by irradiating ultraviolet rays is divided into a primary ultraviolet treatment that uses ultraviolet rays having a long wavelength and a secondary ultraviolet treatment that uses ultraviolet rays having a short wavelength. Therefore, the mechanical characteristics and the layer quality such as adhesive force of the low dielectric constant layer are improved, thereby improving the operational speed of a semiconductor device.

Moreover, the present invention removes the foreign substance in the low dielectric constant layer through a primary ultraviolet treatment, thereby preventing the inside of a process chamber from being polluted by the foreign substance. Accordingly, the manufacturing yield of a semiconductor device can be increased since it is not necessary to conduct an additional process for removing the foreign substance.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming a low dielectric constant layer to fill gaps between conductive lines formed on a semiconductor substrate;
    performing a primary outgassing process to remove an outgassing source contained in the low dielectric constant layer;
    performing a secondary outgassing process to remove a —CH-based outgassing source and a porogen remaining after the primary outgassing process;
    forming a capping layer on the low dielectric constant layer performed the first and secondary outgassing processes; and
    strengthening adhesion between the low dielectric constant layer and the capping layer,
    wherein the step of performing the secondary outgassing process and the step of strengthening adhesion between the low dielectric constant layer and the capping layer are conducted using ultraviolet rays, wherein a wavelength of ultraviolet rays used in the step of performing the secondary outgassing process is longer than a wavelength of ultraviolet rays used in the step of strengthening adhesion between the lower dielectric constant layer and the capping layer.

2. The method according to claim 1, wherein the conductive lines are any one of gate lines, bit lines and metal lines.

3. The method according to claim 1, wherein the step of performing the primary outgassing process comprises baking the low dielectric constant layer at a temperature of 300~350° C.

4. The method according to claim 3, wherein the baking is implemented for 5~60 seconds.

5. The method according to claim 1, wherein the step of performing the secondary outgassing process comprises performing an ultraviolet treatment on the low dielectric constant layer.

6. The method according to claim 5, wherein the ultraviolet treatment is implemented using ultraviolet rays having a wavelength of 300~500 nm.

7. The method according to claim 5, wherein the ultraviolet treatment is implemented for 3~5 minutes.

8. The method according to claim 1, wherein the capping layer is made of an oxide layer.

9. The method according to claim 8, wherein the oxide layer is formed at a temperature of 350~450° C. through PE-CVD.

10. The method according to claim 1, wherein the step of strengthening the adhesion between the low dielectric constant layer and the capping layer is performed through an ultraviolet treatment.

11. The method according to claim 10, wherein, by performing the ultraviolet treatment, foreign substance in the interface between the low dielectric constant layer and the capping layer is removed, such that a mutual adhesion —Si-based and —O-based of the low dielectric constant layer and —Si-based and —O-based of the capping layer is improved.

12. The method according to claim 10, wherein the ultraviolet treatment is performed using ultraviolet rays having a wavelength of 170~300 nm.

* * * * *